(12) United States Patent
Nakai

(10) Patent No.: US 7,943,497 B2
(45) Date of Patent: May 17, 2011

(54) METHOD FOR MANUFACTURING AN SOI SUBSTRATE

(75) Inventor: Tetsuya Nakai, Tokyo (JP)

(73) Assignee: Sumco Corporation, Toyko (JP)

( * ) Notice: Subject to any disclaimer, the term of this patent is extended or adjusted under 35 U.S.C. 154(b) by 1209 days.

(21) Appl. No.: 11/561,195

(22) Filed: Nov. 17, 2006

(65) Prior Publication Data

US 2007/0117361 A1    May 24, 2007

(30) Foreign Application Priority Data

Nov. 18, 2005    (JP) ................. 2005-333618

(51) Int. Cl.
*H01L 21/62*    (2006.01)
*H01L 21/425*    (2006.01)
(52) U.S. Cl. ......... 438/526; 438/926; 438/948; 257/347
(58) Field of Classification Search ................. 438/526, 438/926, 948; 257/347
See application file for complete search history.

(56) References Cited

U.S. PATENT DOCUMENTS

| | | | |
|---|---|---|---|
| 6,613,639 B1 * | 9/2003 | Comard | 438/311 |
| 2002/0022308 A1 * | 2/2002 | Ahn et al. | 438/164 |
| 2005/0287764 A1 * | 12/2005 | Doris et al. | 438/424 |
| 2006/0040476 A1 * | 2/2006 | Sadana et al. | 438/479 |
| 2006/0228846 A1 | 10/2006 | Endo et al. | |
| 2009/0117708 A1 | 5/2009 | Nishihata et al. | |

FOREIGN PATENT DOCUMENTS

JP    05-082525    4/1993

OTHER PUBLICATIONS

English language machine translation of JP 5-082525, Apr. 2, 1993.

* cited by examiner

*Primary Examiner* — Hung Vu
*Assistant Examiner* — Vernon P Webb
(74) *Attorney, Agent, or Firm* — Greenblum & Bernstein, PLC

(57) ABSTRACT

A substrate surface serving as an SOI region and a substrate surface serving as a bulk region are made to form the same plane easily and highly accurately, a thickness of a buried oxide film is made uniform, and the buried oxide film is also prevented from being exposed on the substrate surface. After partially forming a mask oxide film (19) on a surface of a silicon substrate (12), an oxygen ions (16) are implanted into the surface of the substrate through this mask oxide film, and the substrate is further subjected to annealing treatment to form a buried oxide film (13) inside the substrate. Between the step of forming the mask oxide film and the step of implanting the oxygen ions, a recess portion (12*c*) with a predetermined depth deeper than a substrate surface (12*b*) serving as the bulk region where the mask oxide film has been formed is formed in a substrate surface (12*a*) serving as the SOI region where the mask oxide film is not formed.

18 Claims, 2 Drawing Sheets

METHOD FOR MANUFACTURING AN SOI SUBSTRATE

BACKGROUND OF THE INVENTION

1. Field of the Invention

The present invention relates to a method for manufacturing a Silicon-On-Insulator (SOI) substrate having an oxide film which is partially buried inside a silicon substrate with a separation by implanted oxygen (SIMOX) method.

2. Background of the Invention

Conventionally, SOI substrates having a buried oxide film inside a silicon substrate have been expected to be used as a substrate for a high speed and low power device. Among these, an SOI substrates having a buried oxide film, not entirely, but partially inside the silicon substrate (hereinafter, referred to as a "partial SOI substrate.") have become increasingly valued in an LSI system on which an analog portion, a logic portion, and a memory portion are combined. This is because, for example, only the logic portion is formed in the SOI region of the buried oxide film, and the memory portion can be formed in a bulk Si portion without the buried oxide film, or the like.

A method for manufacturing this kind of partial SOI substrate, i.e., a method for manufacturing SIMOX substrate, is disclosed in Japanese Unexamined Patent Publication No. H5-82525 (see claim 2). As shown in FIG. 2, a mask oxide film 4 is first formed on a surface of a substrate 2 (The substrate 2 is cut in a plane perpendicular to an axis of a silicon single crystal rod.) (FIG. 2(a)), and a resist layer 6, patterned by photo lithography, is formed on a surface of this mask oxide film 4 (FIGS. 2(b) and 2(c)). Subsequently, the mask oxide film 4 is patterned by anisotropic etching (FIGS. 2(d) and 2(e)), and after removing the resist layer 6, (FIG. 2(f)), the substrate 2 is cleaned. Next, after implanting oxygen ions 7 into the surface of the substrate 2 (FIG. 2(g)), the substrate 2 is immersed in an etching solution of a mixture of a fluoric acid ammonium solution and a fluoric acid, and then the mask oxide film 4 is removed (FIG. 2(h)). Further, after subjecting the thus treated substrate to an annealing treatment while holding it for a predetermined time at 1300° C. or more in an atmosphere of a mixed gas of argon and oxygen, or a mixed gas of nitrogen and oxygen to thereby form a buried oxide film 3 (FIG. 2(i)), the substrate 2 is immersed in an etching solution of a mixture of a fluoric acid ammonium solution and a fluoric acid, and surface oxide layer 8 is removed (FIG. 20)).

However, according to the aforementioned conventional method for manufacturing the SIMOX substrate, as shown in FIGS. 2(i) and 2(j), since the volume of the oxygen ion region 9 serving as the buried oxide film 3 expands during the annealing treatment after implanting the oxygen ions 7, the substrate surface 2a serving as an SOI region expands more than the substrate surface 2b serving as a bulk region, and thus the problem arises that a step forms on a surface of the substrate 2 after removing the surface oxide layer 8.

Moreover, according to the aforementioned conventional method as shown in FIG. 2(g), a recess 2c is locally formed on the surface of the substrate serving as the SOI region due to sputtering of the oxygen ions 7 during the oxygen ion implantation. Consequently, concerns have arisen that the thickness of the buried oxide film 3 after the annealing treatment has changed, or the buried oxide film 3 has been exposed on the surface of the substrate 2 after the annealing treatment as shown in FIG. 2(j).

SUMMARY OF THE INVENTION

Therefore, it is an object of the present invention to provide a method for manufacturing an SOI substrate, which can easily and highly accurately make a substrate surface serving as an SOI region with the same plane as a substrate surface serving as a bulk region.

It is another object of the present invention to provide a method for manufacturing the SOI substrate, which can make the thickness of the buried oxide film uniform, and also prevent the buried oxide film from being exposed on the substrate surface.

This is accomplished in accordance with the method described in claim 1 wherein an SOI substrate is manufactured by partially forming a mask oxide film 19 on a surface of a silicon substrate 12, implanting oxygen ions 16 on the surface of the substrate 12 through the mask oxide film 19, and subjecting the substrate 12 to an annealing treatment to form a buried oxide film 13 inside the substrate 12 as shown in FIG. 1.

More specifically, between the step of forming the mask oxide film 19 and the step of implanting the oxygen ions 16, a recess portion 12c with a predetermined depth deeper than the substrate surface 12b serving as a bulk region where the mask oxide film 19 has been formed or is formed, in a substrate surface 12a serving as an SOI region where the mask oxide film 19 is not formed.

DETAILED DESCRIPTION OF THE INVENTION

Figure 1:
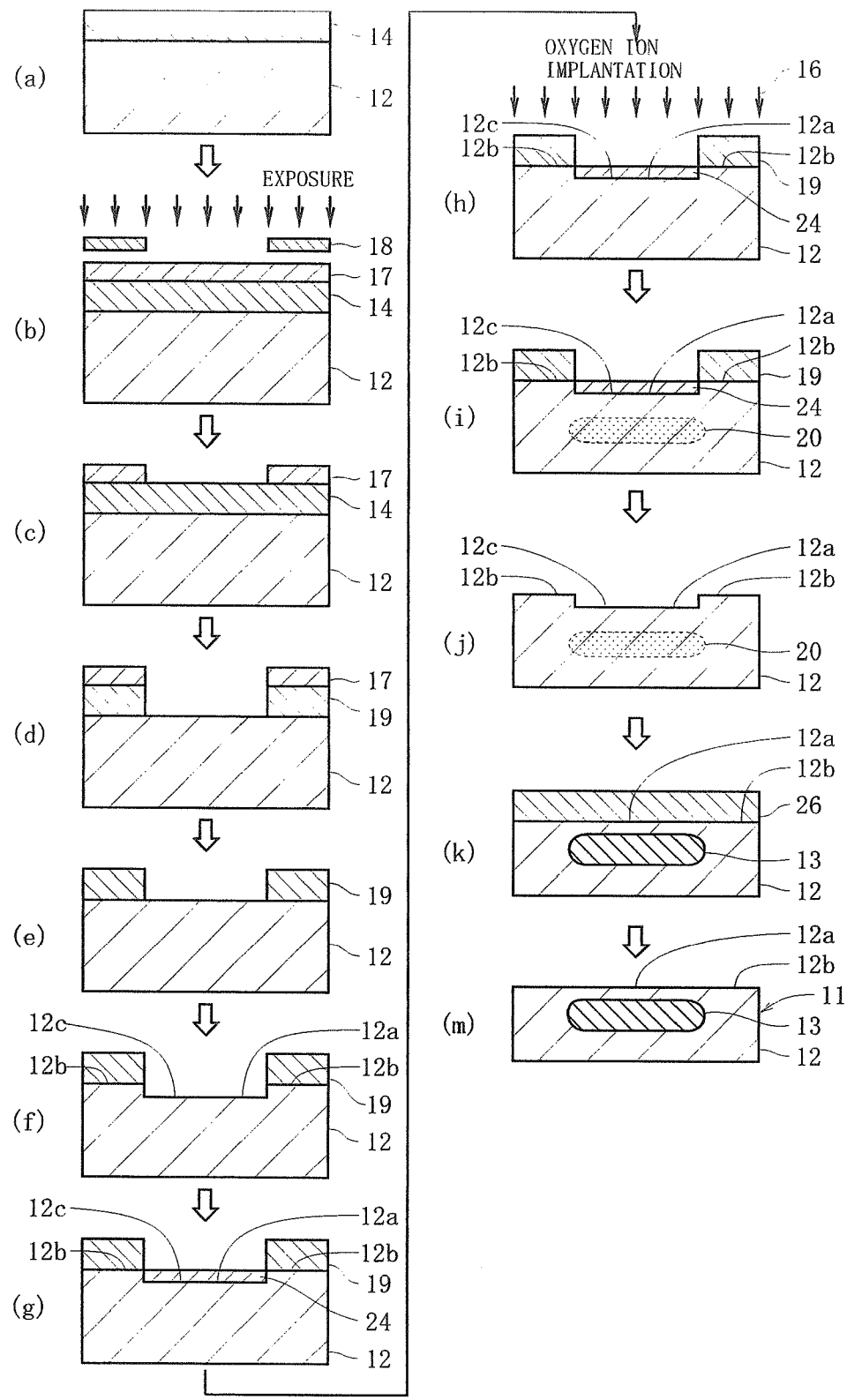
FIG. 1 is a sectional view illustrating, in the order of process, a method for manufacturing an SOI substrate in accordance with an embodiment of the present invention.
Figure 2:
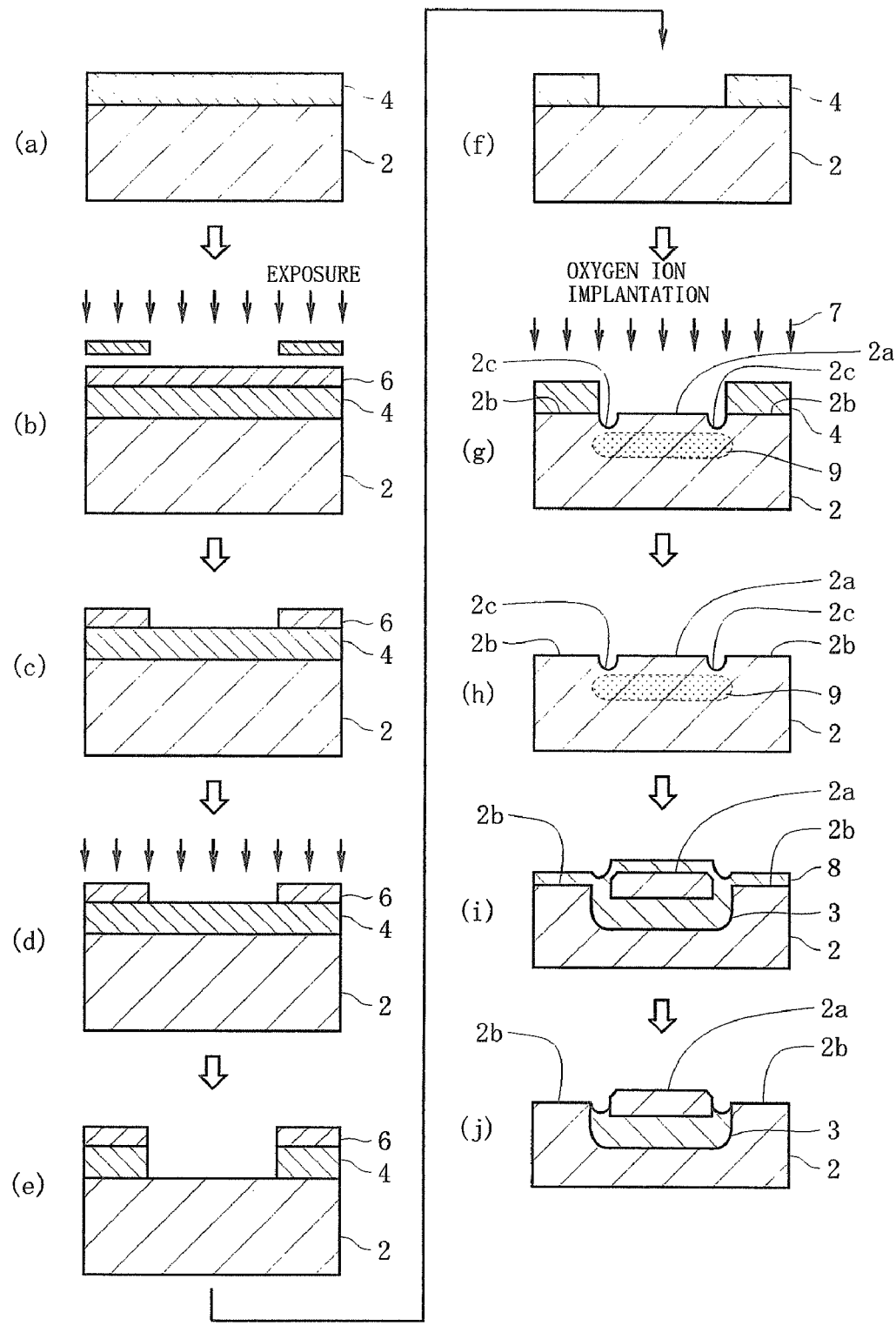
FIG. 2 is a sectional view illustrating a conventional example corresponding to FIG. 1.

In this method for manufacturing the SOI substrate according to claim 1, since a step of forming the recess portion 12c with a predetermined depth deeper than the substrate surface 12b serving as the bulk region in the substrate surface 12a serving as the SOI region is included between the steps of forming the mask oxide film 19 and implanting the oxygen ions 16, only the substrate surface 12a serving as the SOI region is lifted up due to the cubical expansion of the oxygen ion area 20 implanted into the substrate 12 during the annealing treatment, so that the substrate surface 12a serving as the SOI region is formed in the same plane as the substrate surface 12b serving as the bulk region.

The invention in accordance with claim 3 depends on the invention in accordance with claim 1, wherein the recess portion 12c is formed in the substrate surface 12a serving as the SOI region with an Si etching method as shown in FIG. 1.

In this method for manufacturing the SOI substrate according to claim 3, between the step of forming the mask oxide film 19 and the step of implanting the oxygen ion 16, included is a step forming the recess portion 12c in the substrate surface 12a serving as the SOI region with an Si etching method, so that the recess portion 12c can be very accurately formed.

An invention in accordance with claim 4 depends on the invention in accordance with claim 1, and further includes a step of filling the recess portion 12c with a protective film 24 formed by a CVD method, between the step of forming the recess portion 12c and the step of implanting oxygen ions 16 as shown in FIG. 1.

In this method for manufacturing the SOI substrate according to claim 4, the protective film 24 is formed with the CVD method and the recess portion 12c is filled with this protective film 24, so that it is possible to inhibit the substrate surface 12a serving as the SOI region from being locally etched due to sputtering generated along with the oxygen ion implantation.

An invention in accordance with claim 5 depends on the invention in accordance with claim 3, wherein the Si etching method is based on a dry etching method.

In this method for manufacturing the SOI substrate according to claim 5, dry etching suitable for micro fabrication is used as the Si etching method for forming the recess portion, so that the recess portion can be formed in a very accurate manner.

An invention in accordance with claim 6 depends on the invention in accordance with claim 4, wherein the protective film 24 formed by the CVD method is an oxide film as shown in FIG. 1.

In this method for manufacturing the SOI substrate according to claim 6, the protective film 24 is the same oxide film as the mask oxide film 19, so that the protective film 24 and the mask oxide film 19 can be simultaneously removed with the same etching solution.

As described above, according to the present invention, a recess portion is formed between the steps of forming the mask oxide film and implanting oxygen ions. The recess portion has a predetermined depth which is deeper than the substrate surface serving as the bulk region where the mask oxide film has been formed in a substrate surface serving as the SOI region where the mask oxide film is not formed. As a result, only the substrate surface serving as the SOI region is lifted up due to the cubical expansion of the oxygen ion area implanted into the substrate during annealing treatment. Also, the substrate surface serving as the SOI region is formed in the same plane as that of the substrate surface serving as the bulk region. As a result of this, the substrate surface serving as the SOI region and the substrate surface serving as the bulk region can easily and accurately be made to form in the same plane thereby making it possible to prevent focusing being shifted in a subsequent photolithography step for the SOI substrate.

Additionally, if the recess portion is formed in the substrate surface serving as the SOI region with the Si etching method, the recess portion can be highly accurately formed. Also, if the protective film is formed in this recess portion with the CVD method to fill the recess portion, it is possible to inhibit the substrate surface serving as the SOI region from being locally etched due to sputtering along with the oxygen ion implantation. As a result of this, while the thickness of the buried oxide film can be made uniform, the buried oxide film is not exposed on the substrate surface. Hence, the buried oxide film is not etched during the etching of the oxide layer on the substrate surface formed after the annealing treatment and the formation of a hole in the substrate that might generate a particle can be avoided.

Additionally, if the Si etching method is based on the dry etching method, the recess portion formed with this etching method can be highly accurately formed.

Moreover, if the protective film formed with the CVD method is the oxide film, since the protective film is the same oxide film as the mask oxide film, the protective film and the mask oxide film can be simultaneously removed with the same etching solution, thereby, making it possible to reduce the number of steps needed for manufacturing the substrate.

Hereinafter, the best modes for carrying out the present invention will be described with reference to the drawings.

As shown in FIG. 1(k), an SOI substrate 11 has a silicon substrate 12, and a buried oxide film 13 formed inside this substrate 12. The substrate 12 is cut in sliced form along a plane perpendicular to an axis of a silicon single crystal rod grown with the Czochralski (CZ) method [plane (100) of a crystal structure of a silicon single crystal]. Meanwhile, the buried oxide film 13 is formed as follows. Note herein that, the substrate may be cut from a silicon single crystal rod or a silicon single crystal plate grown with a floating zone (FZ) method or the like rather than the CZ method.

First, a surface oxide film 14 is formed on a surface of the substrate 12 (FIG. 1(a)). This surface oxide film 14 is a silicon oxide ($SiO_2$ film), and is formed by thermally oxidizing the substrate 12, or with a Chemical Vapor Deposition method (CVD method). Additionally, the surface oxide film 14 is formed in a thickness range of 200 nm to 1000 nm, preferably in a thickness range of 500 nm to 800 nm. The reason for limiting the thickness of the surface oxide film 14 to the range of 200 nm to 1000 nm is that if it is less than 200 nm, the oxygen ions 16 may pass through the surface oxide film 14 and be implanted into the substrate 12, and the oxygen ions 16 can be sufficiently stopped if it is in the range of 200 nm to 1000 nm. Next, a resist layer 17 with a predetermined pattern is formed on a surface of the surface oxide film 14 by photo lithography (FIGS. 1(b) and 1(c)). This resist layer 17 is exposed using a photomask 18 (FIG. 1(b)), and a predetermined pattern is formed in the resist layer 17 through development and rinse (FIG. 1(c)).

The surface oxide film 14 is anisotropically etched in a direction perpendicular to the surface of the substrate 12 using the aforementioned resist layer 17 as a mask (FIG. 1(d)). In this embodiment, the anisotropic etching is a reactive ion etching in this embodiment. In the reactive ion etching, not illustrated, the substrate is placed on a lower electrode of two facing electrodes arranged within a reaction chamber. A high-frequency voltage is applied to these electrodes to thereby produce a plasma and a highly reactive radical ion core seed is formed by an etching gas, such as $CF_4$, $SF_6$ or the like. The radical ion with tens to hundreds of eV enters into the substrate 12 due to a self bias potential difference caused between the plasma and the substrate 12. As a result, etching of the surface oxide film 14 is proceeded by both the effects of a sputtering action with this radical ion, and a chemical reaction. For this reason, an inner periphery of the surface oxide film 14 results in a vertical etching shape without an undercut. Alternatively, ECR plasma etching may be used as the anisotropic etching. After finishing the etching, the resist layer 17 is removed with a sulfuric acid/hydrogen peroxide solution or the like to thereby leave the mask oxide film 19 with a thickness of 200 nm to 1000 nm, composed of the surface oxide film 14 on the substrate surface without being etched and then the substrate 12 is cleaned (FIG. 1(e)).

Next, a recess portion 12c with a predetermined depth deeper than the substrate surface 12b serving as the bulk region where the mask oxide film 19 has been formed is formed in the substrate surface 12a, serving as the SOI region where the mask oxide film 19 is not formed (FIG. 1(f)). This recess portion 12c is formed with an Si etching method. As the Si etching method for forming this recess portion 12c, although a dry etching method, such as a reactive ion etching method, a chemical dry etching method, or the like, or a wet etching method may be included, the dry etching method which can highly accurately form the recess portion 12c in the substrate surface 12a serving as the SOI region is preferable. After formation, the recess portion 12c, is filled with a protective film 24 formed with a CVD method (FIG. 1(g)). Preferably, the protective film 24 formed with this CVD method is an oxide film ($SiO_2$ film). Thus, since the protective film 24 is the same oxide film as the mask oxide film 19, there is an advantage that the protective film 24 and the mask oxide film 19 can be simultaneously removed with the same etching solution.

Meanwhile, the depth of the aforementioned recess portion 12c is the same amount of the cubical expansion of the buried oxide film 13 formed after the annealing treatment and is calculated by experiment or the like in advance. Specifically, the depth of the aforementioned recess portion 12c is the difference between the thickness of an oxygen ion area 20 implanted into the substrate 12, and the thickness of the buried oxide film 13 formed due to the expansion of the volume of the oxygen ion area 20 by the annealing treatment, and is 30 to 80% of the thickness of the buried oxide film 13 after the annealing treatment, and is preferably 55% thereof. Usually, the buried oxide film 13 is formed in a predetermined thickness within the range of 20 to 200 nm, but when the thickness of the buried oxide film 13 is 20 nm, the depth of the aforementioned recess portion 12c is 6 to 16 nm, preferably 11 nm, whereas when the thickness of the buried oxide film 13 is 200 nm, the depth of the aforementioned recess portion 12c is 105 to 115 nm, preferably 110 nm. Herein, the reason why the depth of the aforementioned recess portion 12c is limited to the range of 30 to 80% of the thickness of the buried oxide film 13 is that the oxygen ions 16 can be implanted into the substrate 12 through the aforementioned protective film 24, and a step caused between the substrate surface 12a serving as the SOI region after the annealing treatment and the substrate surface 12b serving as the bulk region is also eliminated. Incidentally, a situation where there is no aforementioned step is the best, but there may be a case where a slight step is caused due to an error of the target thickness of the protective film 24, an error of the target thickness of the buried oxide film 13, or the like, and if this step is 30 nm or less, it is possible to prevent focusing from being shifted in a subsequent photolithography step.

Next, the oxygen ions 16 are implanted into the surface of the substrate 12 using the mask oxide film 19 as a mask (FIGS. 1(h) and 1(i)). As for implantation conditions of the oxygen ions 16 at this time, the dosage is $1 \times 10^{17}/cm^2$ to $2 \times 10^{18}/cm^2$, preferably $2 \times 10^{17}/cm^2$ to $5 \times 10^{17}/cm^2$, and implantation energy is 20 keV to 200, keV, preferably 60 keV to 180 keV. After the implantation of the oxygen ions 16, the mask oxide film 19 and the protective film 24 on the surface of the substrate 12 are removed by wet etching (FIG. 1(j)). This exposes the recess portion 12c on the substrate surface 12a serving as the SOI region. During the oxygen ion implantation, sputtering is generated along with this oxygen ion implantation, but the substrate surface 12a serving as the SOI region is covered with the protective film 24, and thus, it is possible to prevent the substrate surface 12a serving as the SOI region from being locally etched by the sputtering. After the oxygen ion implantation, the substrate 12 is immersed in a mixed solution (etching solution) of a fluoric acid ammonium solution and a fluoric acid, and the mask oxide film 19 and the protective film 24 on the surface are removed. This slowly cooled down after being held for 2 to 20 hours within the temperature range of 1300 to 1380° C., in an oxidizing atmosphere (FIG. 1(k)).

The oxidizing atmosphere includes a mixed gas atmosphere of inert gas and oxygen, and a mixed gas atmosphere of argon and oxygen, or a mixed gas atmosphere of nitrogen and oxygen are exemplified. The oxidizing atmosphere in this case includes 100 volume percent oxygen, and a preferable oxygen content is 0.5 to 90 volume percent, and more preferably, 40 to 70 volume percent. If the oxygen content is less than 0.5%, oxidization in the surface of the substrate 12 can not be expected during annealing. The oxidization of the oxygen ion area 20 of the substrate 12 is promoted by this annealing treatment, and the buried oxide film 13 is then formed inside the substrate 12. When forming this buried oxide film 13, the oxygen ion area 20 serving as the buried oxide film 13 expands in volume, and only the substrate surface 12a serving as the SOI region expands, and is lifted so as to fill the recess portion 12c, so that the substrate surface 12a serving as the SOI region is formed in the same plane as the substrate surface 12b serving as the bulk region as shown in FIG. 1(k). An oxide layer 26 is simultaneously formed on the surface of the substrate 12 by the annealing treatment. After forming the buried oxide film 13 by the aforementioned annealing treatment, when the substrate 12 is immersed in a mixed solution (etching solution) of a fluoric acid ammonium solution and a fluoric acid to remove the surface oxide layer 26 (FIG. 1(m)), the surface of the SOI substrate 11 becomes flat without any step. As can be understood, the substrate surface 12a serving as the SOI region after the annealing treatment and the substrate surface 12b serving as the bulk region can be made to form in the same plane easily and highly accurately. Thereby, even when the aforementioned SOI substrate 11 is exposed in the photolithography step, it is possible to prevent focusing from being shifted.

Incidentally, as described above, by filling the recess portion 12c with the protective film 24 formed with the CVD method between the step of forming the recess portion 12c and the step of implanting the oxygen ions 16, it is possible to prevent the substrate surface 12a serving as the SOI region from being locally etched due to the sputtering generated along with the oxygen ion implantation, so that the thickness of the buried oxide film 13 can be made uniform, and the buried oxide film 13 is not exposed on the surface of the substrate 12. As a result of this, the buried oxide film 13 is not etched during the etching of the oxide layer 26 on the surface of the substrate 12 formed by the annealing treatment, thus, avoiding the formation of a hole in substrate 12 that might generate a particle.

What is claimed is:

1. A method for manufacturing an SOI substrate wherein a mask oxide film is partially formed on a surface of a silicon substrate, oxygen ions are implanted into the surface of the substrate through the mask oxide film, and the substrate is subjected to an annealing treatment to form a buried oxide film inside the substrate,
   which method further comprises between the step of forming the mask oxide film and the step of implanting the oxygen ions, forming a recess portion with a predetermined depth deeper than the substrate surface serving as a bulk region where the mask oxide film has been formed in the substrate surface serving as an SOI region where the mask oxide film is not formed, and
   filling the recess portion with a protective film formed by a Chemical Vapor Deposition (CVD) method, wherein said predetermined depth of the recess portion is the same amount of the cubical expansion of the buried oxide film formed after the annealing treatment.

2. The method according to claim 1, wherein the depth of the recess portion is 30 to 80% of the thickness of the buried oxide film.

3. The method according to claim 1, wherein the recess portion is formed in the substrate surface serving as the SOI region with an Si etching method.

4. The method according to claim 3, wherein the Si etching method is a dry etching method.

5. The method according to claim 1, wherein the protective film is an oxide film.

6. The method of claim 1 wherein the mask oxide film is from 200 to 1000 nm thick.

7. The method of claim 1 wherein the buried oxide film is from 20 to 200 nm thick.

8. The method of claim 1 wherein the conditions for implanting the oxygen ions as a dosage from $1\times10^{17}/cm^2$ to $2\times10^{18}/cm^2$ and the implantation energy is from 20 keV to 200 keV.

9. The method of claim 1 wherein the annealing treatment is carried out by holding the substrate for 2 to 20 hours at a temperature in the range from 1300 to 1380° C. in an oxidizing atmosphere and then slowly cooling the substrate.

10. An SOI substrate made by the method of claim 1.
11. An SOI substrate made by the method of claim 2.
12. An SOI substrate made by the method of claim 3.
13. An SOI substrate made by the method of claim 4.
14. An SOI substrate made by the method of claim 5.
15. An SOI substrate made by the method of claim 6.
16. An SOI substrate made by the method of claim 7.
17. An SOI substrate made by the method of claim 8.
18. An SOI substrate made by the method of claim 9.

* * * * *